(12) United States Patent
Knebel et al.

(10) Patent No.: US 7,005,008 B2
(45) Date of Patent: Feb. 28, 2006

(54) REACTION VESSEL

(75) Inventors: Günther Knebel, Nürtingen (DE); Lajos Nyársik, Berlin (DE); Holger Friedrich Heinrich Eickhoff, Bassum (DE); Hans Lehrach, Berlin (DE)

(73) Assignees: Greiner Bio-One GmbH, Frickenhausen (DE), part interest; Max-Planck-Gesellschaft zur Förderung der Wissenschaft e.V., Munich (DE), part interest ( * ) Notice: Subject to any disclaimer, the term of this patent is extended or adjusted under 35 U.S.C. 154(b) by 368 days.

(21) Appl. No.: 09/883,435

(22) Filed: Jun. 18, 2001

(65) Prior Publication Data
US 2002/0189537 A1  Dec. 19, 2002

(51) Int. Cl.
*C30B 35/00* (2006.01)
*B01D 9/02* (2006.01)

(52) U.S. Cl. ...................... 117/206; 422/253
(58) Field of Classification Search .............. 117/200, 117/206; 422/245.1, 252, 253
See application file for complete search history.

(56) References Cited

U.S. PATENT DOCUMENTS

| | | | | |
|---|---|---|---|---|
| 5,096,676 | A * | 3/1992 | McPherson et al. | 422/245 |
| 5,419,278 | A * | 5/1995 | Carter | 117/206 |
| 6,039,804 | A * | 3/2000 | Kim et al. | 117/206 |
| 6,258,331 | B1 * | 7/2001 | Sanjoh et al. | 422/245.1 |
| 6,267,935 | B1 * | 7/2001 | Hol et al. | 422/245.1 |
| 6,447,726 | B1 * | 9/2002 | Delucas et al. | 422/99 |
| 2002/0106318 | A1 * | 8/2002 | Delucas et al. | 422/245.1 |
| 2002/0122760 | A1 * | 9/2002 | Delucas et al. | 422/245.1 |

* cited by examiner

*Primary Examiner*—Gregory Mills
*Assistant Examiner*—Matthew Anderson
(74) *Attorney, Agent, or Firm*—Collard & Roe, P.C.

(57) ABSTRACT

The invention relates to a reaction vessel (1) for producing a sample, in particular a crystal, from a substance in solution or in liquid form, having several reaction chambers (6) each forming a separate gas chamber, consisting of at least one housing part, and each reaction chamber (6) has a reservoir (7) and several reaction areas (8) co-operating therewith, connected to one another and to the reservoir (7) in order to exchange gas. The reservoirs and the reaction areas co-operating with them are disposed immediately adjacent to one another in rows, distributed in a predeterminable, identical manner, these rows running parallel with one another. Each row of reservoirs (7) therefore co-operates with at least one row of reaction areas (8).

5 Claims, 7 Drawing Sheets

REACTION VESSEL

BACKGROUND OF THE INVENTION

1. Field of the Invention

The invention relates to a reaction vessel for producing a sample, in particular a crystal, from a substance in solution or in liquid form, having several reaction chambers, each of which forms a separate gas chamber, formed by at least one housing part and each reaction chamber has a reservoir and, connected to the reservoir, several reaction areas co-operating therewith to produce a gas exchange.

The invention also relates to a reaction vessel having at least a vessel bottom part with a vessel floor and vessel walls forming at least one reaction chamber, the reaction chamber having a reservoir for liquid agents and at least a reaction area separated from the reservoir and having a gas connection thereto.

The invention further relates to a vessel cover for producing a sample, in particular a crystal, from a substance in liquid form or in solution, having several reaction areas on an underside.

2. The Prior Art X-ray diffraction is one of the most important tools in investigating structures of chemical substances. Particularly in modern molecular biology, crystallographic tests on macro-molecules such as protein and nucleic acids and their numerous complexes can lead to valuable conclusions about their properties and the way in which they work.

The most important aspect of carrying out structural analyses by X-ray diffraction is to be able to produce sufficiently large crystals, particularly single crystals of the substance to be investigated, which are as far as possible fault-free. In the case of biological macro-molecules, because crystal growth is very sensitive and highly dependent on a number of physical and chemical parameters, crystal culture is a factor which severely limits structural investigation in modern biology.

One of the most important methods of producing crystals of macro-molecules is based on the principle of vapour diffusion. This involves mixing a small quantity of the macro-molecule sample with a crystallisation solution and enclosing this solution, in a container, in the form of a droplet with a significantly larger quantity of the crystallisation solution, which is contained separately. By being able to exchange vapour between the crystallisation droplet and the reservoir, a change in concentration is brought about in the crystallisation droplet, which over-saturates the dissolved macro-molecules so that a crystal gradually starts to form in the droplet.

Because growing crystals of macro-molecules is very sensitive and dependent on a whole range of parameters, it is necessary to conduct a lot of tests in order to establish the parameters under which crystals suitable for structural analysis can be grown.

Various systems have been proposed as a means of conducting tests in large numbers, with the most varied combinations of variables influencing crystallisation. A device is known from U.S. Pat. No. 6,039,804 A, for example, which has 24 reservoirs for the crystallisation solvent, every reservoir having four droplet chambers disposed around it. With the droplet chambers disposed in this arrangement and with the arrangements proposed in other solutions, however, only a very small percentage of the surface area available on the device for accommodating droplet chambers is used. With the known systems, however, experience has shown that the process chambers for droplets in the form of what are known as suspended droplets placed on the underside of a chamber cover is fraught with difficulties and prone to error. A glass plate is generally used as a chamber cover. However, it is not always possible to position droplets on a glass plate with sufficient accuracy, which makes optical control of the crystal growth more difficult. Furthermore, because the glass plate is usually placed on the droplet chambers with a sealing layer of silicon grease in between and the silicon grease reduces friction, it frequently happens that the glass plate is inadvertently displaced.

The requirements of modern biology in particular are such that it is necessary to be able conduct an extremely large number of crystallisation tests with the most varied of parameters simultaneously. At the same time, it is also necessary to be able to automate these tests, both in terms of preparation and the controls applied to crystal growth by microscopic observation during the relatively long crystallisation process.

SUMMARY OF THE INVENTION

Accordingly, the objective of the invention is to propose a reaction vessel for producing a sample, in particular a crystal, by means of which a plurality of production processes can be operated with different process parameters with a very high efficiency.

This objective is achieved by the invention by means of a reaction vessel for producing a sample, in particular a crystal, from a substance in liquid form or in solution, having several reaction chambers, each forming a separate gas chamber, consisting of at least one housing part and each reaction chamber has a reservoir and several reaction areas co-operating therewith to exchange gas with one another and connected to the reservoir, characterised in that the reservoirs and the reaction areas co-operating therewith are disposed immediately adjacent to one another in rows, distributed in a predeterminable, identical manner, these rows running parallel with one another, and each row of reservoirs cooperating with a row of reaction areas.

The advantage of this reaction vessel resides in the fact that because the containers or reaction areas are arranged in parallel rows, a very high density of containers or reaction areas can be provided. When filling the containers with crystallisation solution or when filling the reaction areas with crystallisation solution, this layout offering another advantage in that filling devices can be used which are suitable for filling several containers or reaction areas at the same time.

Other designs of the reaction vessel in which the reaction chambers are of the same structure and the undersides of the vessel floors of the reaction chambers come into contact with a plane parallel with the standing plane offer an advantage, due to the fact that, during automated manipulations such as filling or optical detection in particular, because of their planar position and the fact that they are identical in structure, the displacements needed relative to same reference points of reaction chambers are always the same, parallel with the standing plane, even for different reaction chambers.

As a result of the design whereby reservoirs are disposed in consecutive rows at a predeterminable distance from another, respective consecutive rows of reservoirs are arranged at a same distance from one another and adjacent reservoirs of any two consecutive rows are offset from one another by a predeterminable same distance and in the same direction relative to the rows, as a result of which filling devices with particularly simple and regular arrangements of filling orifices can be used.

Automated manipulation of the reaction vessels is made particularly easy in another embodiment in which the reservoirs are arranged in a rectangular pattern.

In another embodiment, a housing part is provided in the form of an at least approximately plate-shaped housing bottom part, consisting of vessel bottom parts forming the reaction chambers and a frame extending laterally from an edge of a top face of he housing bottom part down to the bottom faces of the vessel floors, the advantage of this being that the plate-shaped structure of the housing bottom part means that reaction vessels can be assembled from very few housing parts and, in the most practical case, only two.

As a result of another embodiment in which the vessel bottom parts comprise at least one reservoir and several reaction areas, three reaction areas are provided in the vessel bottom parts and the reservoirs and the reaction areas are designed to contain fluids, with the advantage that if only the reaction areas of the vessel bottom parts are to be used to bring about reactions or produce a sample, only the housing bottom part needs to be inserted in a filling device in order to fill the container and the reaction areas.

The advantage of another embodiment, in which the reaction areas of the vessel bottom parts are disposed in the region of 5 mm to 10 mm above the vessel floor of the reservoir, is that the reaction areas are more readily accessible for any optical controls of the crystallisation growth operated from above.

Also of advantage is the reaction vessel in which the reaction areas of the housing bottom parts are provided in the form of recesses with a capacity in the region of less than 5 $\mu l$ and the recesses are designed as a plate-like, square cube, which means that drops of samples dissolved in crystallisation solution can be securely contained in small volumes on the one hand and a reaction area of this size affords ready access for optical control by means of a microscope.

The embodiment of the reaction vessel in which the floors of the recesses are of an at least approximately convex curvature has an advantage in that liquid droplets are more easily contained in recesses of this shape. When a liquid droplet is set down, the surface tension acting against adhesion between the walls of a recess and the boundary surface of the liquid is reduced in proportion to the degree to which the shape of the recess resembles the approximately spherical curvature of a droplet of liquid.

With the embodiments of the reaction vessel in which the rows of reaction areas in the housing bottom part lie respectively adjacent to the rows of reservoirs as seen in a plan view onto the standing plane and the cross section of the reservoir is rectangular on a plane parallel with the standing plane, efficient use is made of the space available for the reaction areas and the containers.

Standardised filling and testing devices such as those readily available for micro-titre plates can be used in conjunction with the reaction chambers proposed by the invention as a result of one advantageous embodiment of a reaction vessel in which the frame of the housing bottom part and the layout of the reaction chambers are made to the standard size of a micro-titre plate and a predeterminable number of reaction chambers is provided in the housing bottom part, this number being selected from a group based on the mathematical formula $3 \times 2^N$ where N is a natural number.

The structure of the reaction vessel in which the housing bottom part is made from a transparent plastics material is of advantage because it can be illuminated from underneath for the purpose of optically controlling crystallisation in the reaction areas.

In the most practical case, the reaction vessel may consist of only two parts and all reaction chambers can be closed at the same time by fitting the housing bottom part to the vessel cover due to another embodiment, in which one housing part is a more or less lid-type vessel cover with grooves on the underside and vessel top parts containing at least one reaction area are bounded by the grooves and a frame is formed on the edge of the underside of the vessel cover projecting beyond the underside.

Also of advantage is another embodiment of the reaction vessel, in which the vessel top parts are designed to have several reaction areas, the vessel top parts having two reaction areas and the reaction areas of the vessel top parts being designed to contain liquids, since this makes even more efficient use of the space.

In other advantageous embodiments of the reaction vessel, the reaction areas of the vessel top parts are provided in the form of recesses, the recesses of the vessel top parts being of a cylindrical disc shape, and the recesses of the vessel top parts have a capacity in the region of less than 5 $\mu l$, which means that the reaction areas can be disposed considerably more densely, making positioning of the suspended droplets considerably more accurate. The risk of two suspended drops overflowing during preparation and fitting the vessel cover on the housing bottom part is very significantly reduced as a result.

The embodiment of the reaction vessel in which the floors of the recesses forming the reaction areas are of an at least approximately convex curvature has an advantage in that liquid droplets are more easily contained in recesses of this shape. Due to the fact that the spherical curvature of a liquid droplet tends to conform to the shape of such recesses, the surface tension acting against adhesion when a liquid droplet is placed in a recess is more easily overcome.

The design of reaction vessel in which, looking down onto the standing plane, the rows of reaction areas of the vessel cover lie respectively adjacent to rows of reactions areas of the housing bottom part, if any are provided, has an advantage in that the reaction areas of the housing bottom part and the vessel cover can be observed from above without having to take the vessel cover off the housing bottom part.

In another embodiment in which the frame of the vessel cover and the design of the vessel top parts are made to the standard size of a micro-titre plate and a predeterminable number of vessel top parts are provided in the vessel cover, the number being selected from a group based on the mathematical formula $3 \times 2^N$ where N is a whole number, standard filling and analysis devices for miro-titre plates can advantageously be used.

Also of advantage is another embodiment in which the vessel cover is made from a transparent plastics material since the reaction chambers can be observed by means of light-optical devices, e.g. microscopes.

Advantage is to be had from another embodiment in which a mask is applied to a surface of the vessel cover remote from the reaction areas and this mask surrounds the reaction areas with a light-screening surface, as seen in a plan view onto the standing plane, so that scattered light can be prevented when photographing the reaction areas which would otherwise be detrimental to the image quality. If testing of the reactions in the reaction areas is automated, the masks may also be used as a means of establishing the exact position of the analysis device above the reaction area with the aid of optical sensors.

The objective of the invention is also independently achieved by means of a reaction vessel for producing a sample, in particular of a crystal, from a substance in solution or in liquid form, having several reaction chambers each forming a separate gas chamber, made up of at least one housing part and each reaction chamber has a reservoir and several reaction areas co-operating therewith, connected to one another and to the reservoir in order to exchange gas, characterised in that the reaction chambers are in the form of prisms with a regular hexagonal base surface and these reaction chambers are disposed in a honeycomb arrangement. The advantages gained by this arrangement reside in the fact that, because of the regular hexagonal base surface of the reaction chambers, the probability of errors when filling the reaction chambers can be reduced. For the same surface area, the distance from the centre point of the surface to the adjacent edge of a hexagon is always greater than is the case with a square. The honeycomb pattern of the cross sections of the reaction chambers therefore offers the advantage of a greater leeway for errors.

The objective of the invention is also independently achieved by means of a reaction vessel comprising at least a vessel bottom part with a vessel floor and vessel walls, forming at least one reaction chamber, the reaction chamber having a reservoir for liquid agents and at least one reaction area separated from the reservoir and having a gas connection thereto, characterised in that the reaction chamber is covered by a vessel top part, which lies at least against the vessel walls, optionally with a sealing layer in between, and having at least another reaction area above the reservoir. The advantages of this arrangement reside in the fact that by providing additional reaction areas in the vessel top part, better use is made of the available capacity of the reaction chamber.

Another embodiment of the reaction vessel in which several reaction chambers are provided and adjacent reaction chambers are each separated from one another by a common vessel wall offers an advantage in that the highest possible density of reaction chambers can be provided due to the fact that the reaction chambers are separated by a common vessel wall.

The advantage of another embodiment of the reaction vessel where the reaction areas of a vessel-type design and every two are separated from one another by a common wall is that efficient use is made of the capacity available for the reaction chambers and, secondly, the material required to make these reaction vessels is reduced to a minimum because of the common wall design.

Another independent solution to the task set by the invention is provided in the form of a vessel cover for producing a sample, in particular a crystal, from a substance in solution or liquid form, having several reaction areas on an underside, characterised in that the reaction areas are respectively disposed in rows with a predeterminable division, these rows being laid out parallel with one another.

The advantage of this vessel cover is that arranging the reaction areas in parallel rows makes for a rational approach to filling the reaction areas and filling devices can be used for this purpose which are suitable for filling several reaction areas simultaneously. With vessel covers of this type, however, it is also possible to form reaction chambers by combining a vessel cover with a housing bottom part, itself consisting only of reservoirs with a layout of reaction areas in a matching distribution.

The advantage of an embodiment in which the reaction areas are laid out in rows with a same distribution and immediately adjacent to one another is that reaction areas can be laid out in a particularly dense arrangement.

The embodiment of the vessel cover in which a frame is provided on an edge of the underside projecting beyond the underside makes it easier to fit the vessel cover to a housing bottom part matching the vessel cover once the reaction areas have been filled.

The embodiment of the vessel cover in which grooves are provided on the underside, by means of which vessel top parts having at least one reaction area are bounded, is of advantage because the edges of the vessel bottom parts of a housing bottom part matching the vessel cover can be inserted in the grooves, there by producing tightly sealed reaction chambers.

In embodiments of the vessel cover in which the reaction areas are designed to receive liquids, the reaction areas are provided in the form of recesses, the recesses being of a cylindrical disc shape and the recesses having a capacity in the region of less than 5 $\mu$l, the advantage of which is that the reaction areas can be more densely laid out, thereby significantly reducing the propensity to errors which might otherwise be caused by the overflow of two suspended droplets during preparation and when fitting the vessel cover on a matching housing bottom part.

Also of advantage is the embodiment of the vessel cover in which the floors of the recesses are of an at least approximately convex curvature, since liquid droplets are more easily contained in recesses of this shape. Due to the fact that the spherical curvature of a liquid droplet tends to conform to the shape of such recesses, the surface tension acting against adhesion when a liquid droplet is placed in a recess is reduced.

With the embodiments of the vessel cover in which the frame and the layout of the vessel top parts are designed to the standard size of a micro-titre plate and a predeterminable number of vessel top parts is provided, the number being selected from a group based on the mathematical formula of $3 \times 2^N$ where N is a natural number, standardised filling and analysis devices commonly used for micro-titre plates can advantageously be used.

The advantage of the embodiment of the vessel cover in which the material is a transparent plastics material is that the reactions in the reaction areas can be observed using optical light instruments, e.g. microscopes.

Also of advantage is the embodiment of the vessel cover in which a mask is applied to the surface remote from the reaction regions and this mask, seen in a plan view onto the standing plane, surrounds the reaction areas with a light-screening surface, since this avoids any scattered light which might otherwise be detrimental to image quality when taking photographs. If using automated analysis devices in which the position of the reaction areas is located by means of optical sensors, these masks can also be used as a means of determining position.

BRIEF DESCRIPTION OF THE DRAWINGS

The invention will be described in more detail below with reference to examples of different embodiments illustrated in the appended drawings, wherein.

DETAILED DESCRIPTION OF PREFERRED EMBODIMENTS

Figure 1:
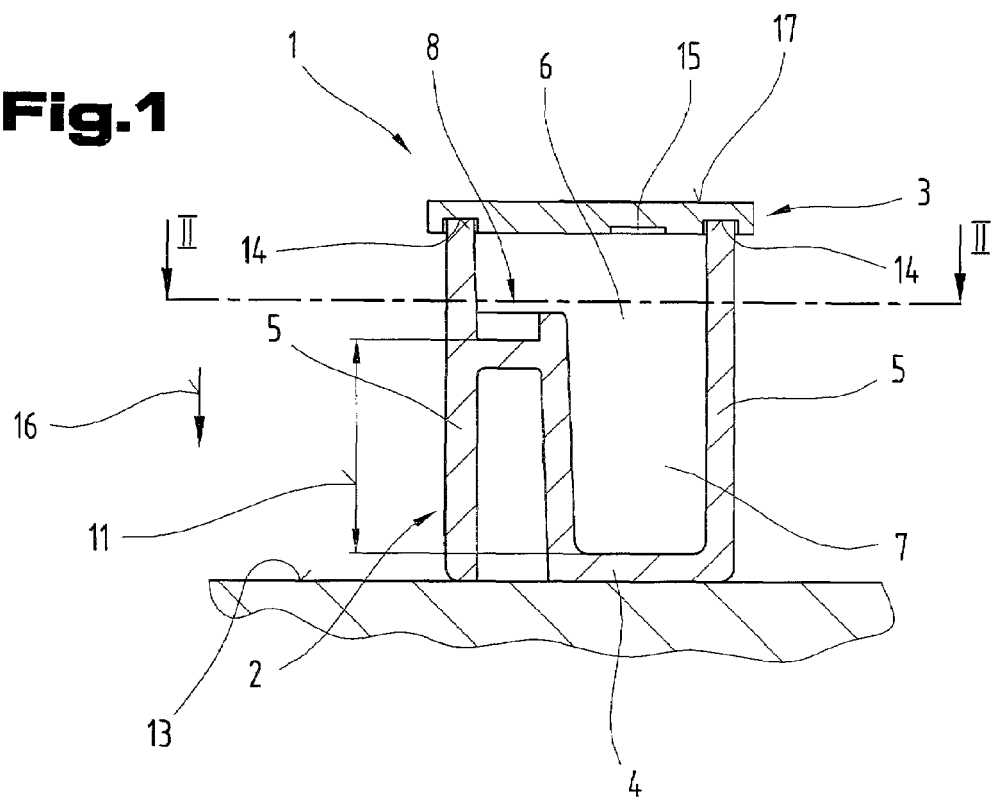
FIG. 1 is a reaction vessel consisting of a vessel bottom part and a vessel top part.

Firstly, it should be pointed out that the same parts described in the different embodiments are denoted by the same reference numbers and the same component names and the disclosures made throughout the description can be transposed in terms of meaning to same parts bearing the same reference numbers or same component names. Furthermore, the positions chosen for the purposes of the description, such as top, bottom, side, etc,. relate to the drawing specifically being described and can be transposed in terms of meaning to a new position when another position is being described. Individual features or combinations of features from the different embodiments illustrated and described may be construed as independent inventive solutions or solutions proposed by the invention in their own right.

Figure 2:
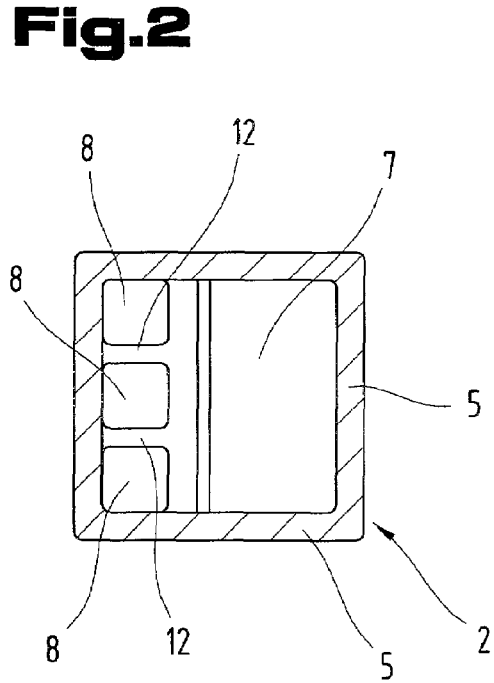
FIG. 2 is a section of a reaction vessel as illustrated in FIG. 1.
Figure 3:
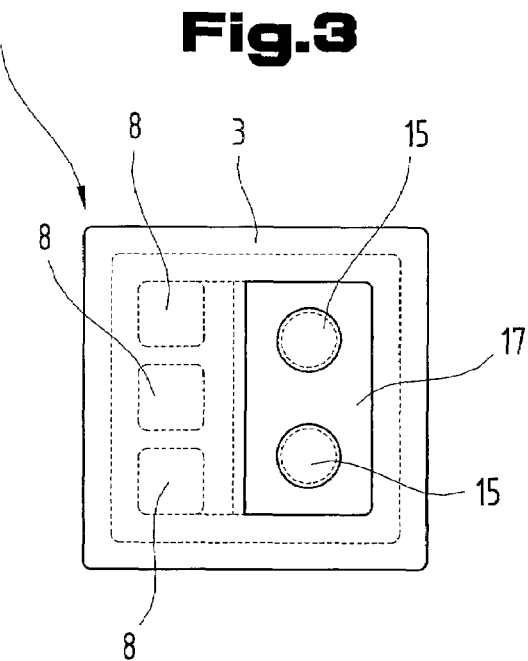
FIG. 3 is a plan view of a reaction vessel as illustrated in FIG. 1.

FIGS. 1 to 3 illustrate a reaction vessel 1 consisting of a vessel bottom part 2 and a vessel top part 3. The vessel bottom part 2 consists of a vessel floor 4 and vessel walls 5, which form a reaction chamber 6. Disposed in the reaction chamber 6 is a reservoir 7 and three reaction areas 8 arranged at a higher position above the vessel floor 4.

The base surface area of the reaction vessel 1 is square having a side length of approximately 10 mm. The reaction areas 8 are arranged at a height 11 of approximately 7.5 mm above the vessel floor 4, lying in a row one immediately after the other, and bounded to the side by one of the vessel walls 5. The concept of row is intended to be understood in a geometric context as meaning a linear arrangement of identical objects such that same points of the object lie respectively on a same straight line.

The reaction areas 8 are provided in the form of a recess with two immediately adjacent reaction areas 8 being separated from one another by a common wall 12. The capacity of a reaction area 8 is approximately 4 μl, the shape being more or less that of a cube with side lengths of 2 mm×2 mm×1 mm.

The cross section of the reservoir 7 on a plane parallel with the standing plane 13 is four-cornered, in particular rectangular.

The reservoir 7 is specifically designed to hold liquid agents and the reaction area 8 for receiving a sample. The reservoir 7 is intended to be filled with the agent so that the reaction area 8 is always located above the level of the liquid surface in the reservoir 7. This means that when working with the reaction vessel 1 in its position of usage, there can be no exchange of liquid between the reservoir 7 and the reaction area 8, i.e. there can be an exchange of substances in the agent or sample in the form of a gas or vapour only.

The vessel top part 3 is of a plate-shaped design and is placed in a sealed fit on the vessel walls 5 of the vessel bottom part 2 with a sealing layer 14 in between. The vessel top part 3 has two reaction areas 15, which also have a gas connection to the reaction chamber 6. The reaction areas 15 are provided in the form of two cylindrical disc-shaped recesses in the vessel top part 3.

The reservoir 7 and the reaction areas 8 and 15 are designed to receive liquids.

The reaction vessel 1 is used for the purpose of conducting reactions, during which an exchange of gas takes place between an agent disposed in the reservoir 7 and samples placed in the reaction regions 8 and 15. Such a reaction might be, for example, the production of a crystal from a sample dissolved in a crystallisation solution using the principle of vapour diffusion. There is a shift in concentration in the drops of samples dissolved in a crystallisation fluid, located in the reaction areas 8 and 15 caused by the exchange of gas with the crystallisation solution contained in the reservoir 7, causing crystals to form. The reaction areas 8 and 15 have a capacity of approximately 4 μl.

A drop located in a reaction area 8 is referred to as a sitting drop and a drop in the reaction area 15 is referred to as a suspended drop. The floors of the recesses forming the reaction areas 8 and 15 may also be of an at least approximately convex curvature (not illustrated). This means that by widening the recesses, the floors or the floor regions of the recesses can be designed to have a bevelled, truncated cone or sphere segment shape or combinations of such bodies. Using this type of design for the reaction areas 8, 15 helps to keep the liquid droplet stationary.

The vessel top part 3 is made from a transparent plastics material so that crystal growth in the reaction areas 8 and 15 can be observed through the vessel top part 3. Looking down on the reaction vessel 1 as indicated by an arrow 16 in FIG. 1, the row of reaction areas 8 lies adjacent to the row comprising the two reaction areas 15. Accordingly, the row of reaction areas 15 lies above the reservoir 7. The row of reaction areas 8 is therefore laterally offset from the row of reaction areas 15, which means that the reactions taking place in reaction areas 8 and 15 can also be observed unhindered without having to open the reaction vessel.

FIG. 3 illustrates a plan view of the reaction vessel 1 in the direction indicated by arrow 16 of FIG. 1. A mask 17 is applied to the vessel top part 3 of the reaction vessel 1. The mask 17 consists of a light-screening or light-impermeable layer and surrounds the reaction areas 15. As a result of the light-screening effect of the mask 17, disruptive scattered light is screened out of the reaction areas 15 when observing the reactions.

A reaction vessel 1 as illustrated in FIGS. 1 to 3 is suitable for conducting tests in which miniaturisation is of particular importance. For example, it is possible to arrange a larger number of such reaction vessels 1 in a specially designed holding container in order to conduct a large number of reactions simultaneously.

Figure 4:
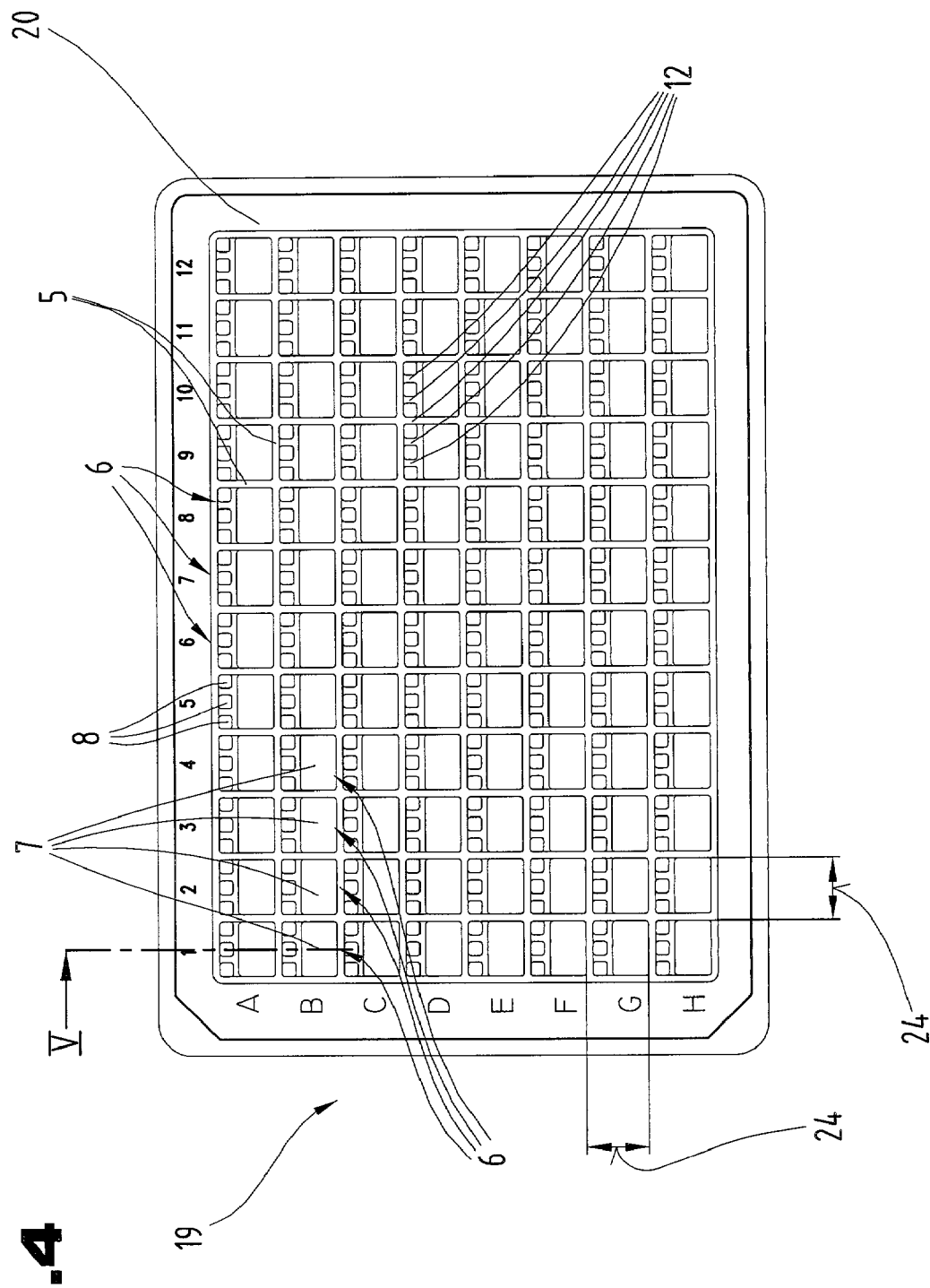
FIG. 4 is a housing bottom part of a reaction vessel.
Figure 5:
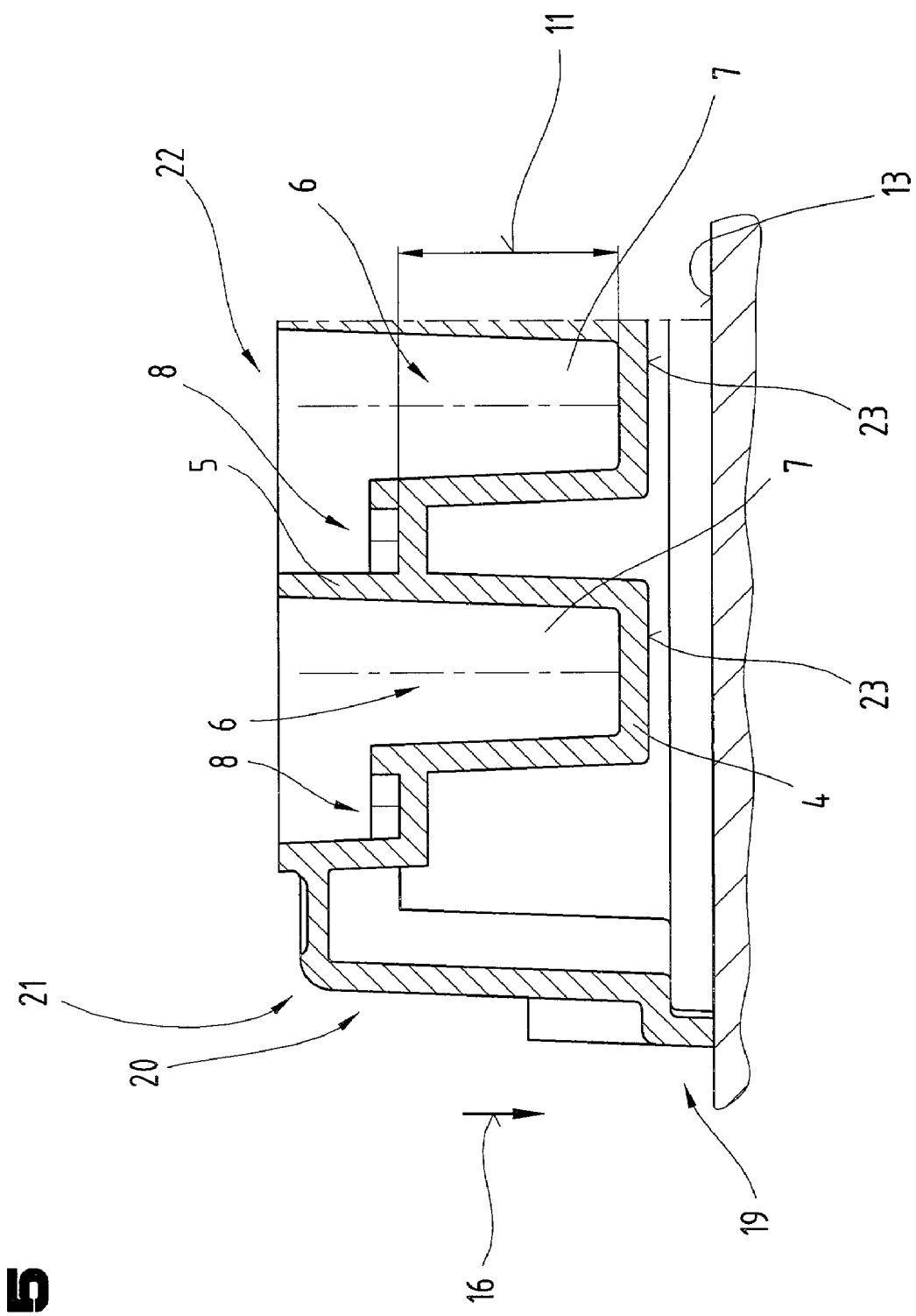
FIG. 5 is a section of a housing bottom part as illustrated in FIG. 4.

FIGS. 4 and 5 illustrate a housing bottom part 19 of a reaction vessel as proposed by the invention. The housing bottom part 19 consists of a frame 20 in which reaction chambers 6 are provided. The housing bottom part 19 is therefore of a more or less plate-type design. The frame 20 extends from one edge 21 of a top face 22 of the housing bottom part 19 down to the undersides 23 of the vessel floors 4. The internal structure of a reaction chamber 6 corresponds to that of a vessel bottom part 2 as described with reference to FIGS. 1 to 3. In other words, the reaction chambers 6 of the housing bottom part 19 are of identical structure and uniformly arranged so that the undersides 23 of the vessel floors 4 of the reaction chambers 6 are brought into contact with a plane parallel with the standing plane 13. This being the case, respective reaction chambers 6 lying adjacent to one another are separated from one another by at least one common vessel wall 5. The base surface areas of the reaction chambers 6 are square in shape.

In a housing bottom part 19, the reaction chambers 6 are arranged in a right-angled pattern with a row width 24 of 9 mm within a frame 20 which is constructed to the standard size of a micro-titre plate. The housing bottom part 19 therefore has a total of 96 reaction chambers 6. Accordingly, respectively adjacent reservoirs 7 which are separated from one another by only a vessel wall 5 form a total of 8 reservoirs 7 separated from one another and disposed in immediately adjacent rows parallel with one another. These rows are aligned parallel with the longitudinal extension of the housing bottom part 19 so that respective consecutive rows of reservoirs are arranged at the same distance from one another. In an alternative embodiment of the housing bottom part 19, however, the rows may also be aligned perpendicular to the longitudinal extension.

Clearly, housing bottom parts 19 may also made to a standard size of micro-titre plates with a different number of reaction chambers 6, for example 24, 48, 96, 192, 384, 768, 1536, 3072, 6144, etc., i.e. the number may be selected from a group based on the mathematical formula of $3 \times 2^N$ where N is a natural number.

Clearly, it would also be possible to provide housing bottom parts 19 in which respective consecutive rows of reaction chambers 6 are offset from one another by a pre-definable, identical distance in the direction of the longitudinal extension of the rows.

3 reaction areas 8 are arranged one after another in a row in each reaction chamber 6. This being the case, the reaction areas 8 are arranged parallel with the longitudinal extension of the housing bottom part 19 forming eight respective immediately adjacent rows of reaction areas separated from one another. Accordingly, the rows of reservoirs 7 and reaction areas 8 are aligned respectively parallel with one another and a row of reaction areas 8 always lies next to a row of reservoirs 7 relative to the plan view indicated by the direction of the arrow 16 in FIG. 5. In view of the regular layout of reaction chambers 6 in the housing bottom part 19 with a row width 24, the rows of reservoirs 7 and reaction areas 8 are uniformly distributed across its length. This layout has proved to be favourable, particularly if using an automated system to fill the reaction areas 8 and the reservoirs 7.

With the layout of reaction chambers 6 illustrated in FIG. 4, very efficient use is made of the available capacity and the available base surface area of the housing bottom part 19. Clearly, it would also be possible to design the base surface area of the reaction chambers 6 as rectangular or in the form of a parallelogram. Another alternative would be to arrange the parallel rows of reaction chambers 6 offset from one another in the direction of the longitudinal extension of the housing bottom part 19. In another embodiment, it would also be possible for the reaction chambers 6 to be of a regular hexagonal cross section, in which case the reaction chambers 6 will be laid out in a honeycomb arrangement.

The material from which the housing bottom part 19 is made is a transparent plastics material, preferably polystyrene. The housing bottom part 19 may, of course, be made from a different material, preferably plastics, suitable for moulding by an injection moulding technique.

Figure 6:
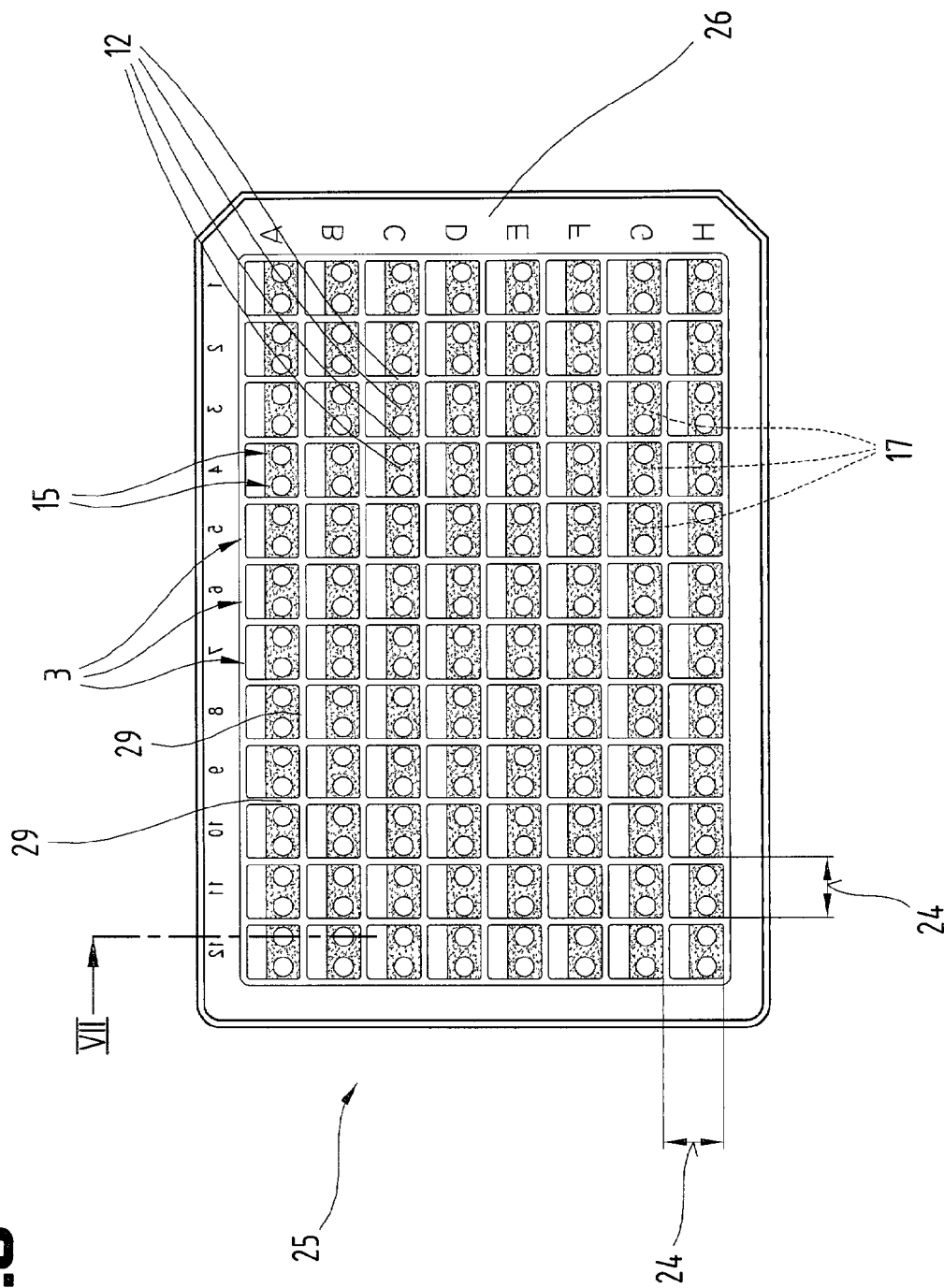
FIG. 6 is a vessel cover of a reaction vessel.
Figure 7:
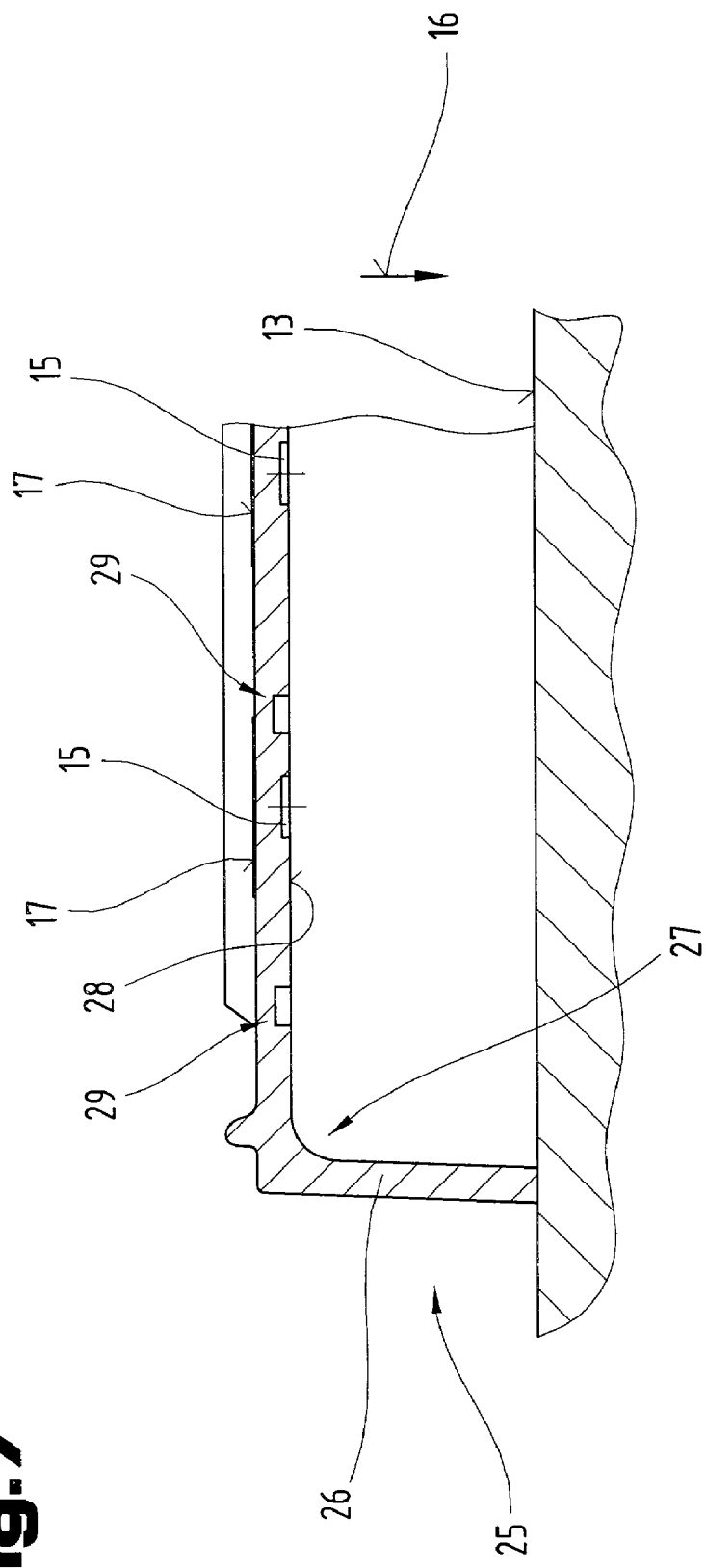
FIG. 7 is a section of a vessel cover as illustrated in FIG. 6.

FIGS. 6 and 7 illustrate a vessel cover 25 of a reaction vessel proposed by the invention. The vessel cover 25 comprises a frame 26 and an arrangement of 96 vessel top parts 3 integrally joined thereto, as described with reference to FIGS. 1 to 3. The vessel cover 25 is therefore provided in the form of a lid-type design. On an edge 27 of an underside 28 of the vessel cover 25, the frame 26 stands proud of the underside 28. The vessel top parts 3 are arranged in a right-angled pattern with a row width 24 of 9 mm in the direction of the longitudinal extension of the vessel cover 25 and at a right angle to the longitudinal extension of the vessel cover 25. The housing top part 25 is made to the standard size of a micro-titre plate. Respective, immediately adjacent vessel top parts 3 have a common groove 29. The grooves 29 are arranged so that they can be placed on the vessel walls 5 of the vessel bottom part 2 (FIGS. 4 and 5). Every vessel top part 3 has two cylindrical, disc-shaped reaction areas 15, which makes a total of eight rows of adjacent reaction areas 15. These rows are aligned parallel with the longitudinal extension of the vessel cover 25 and are evenly distributed across its length.

Clearly, it would also be possible to design vessel covers 25 to the standard size of micro-titre plates with a different number of reaction chambers 6, for example 24, 48, 96, 192, 384, 768, 1536, 3072, 6144, etc., i.e. the number may be selected from a group based on the mathematical formula $3 \times 2^N$ where N is a natural number.

The vessel cover 25 is made from a transparent plastics material, preferably polystyrene. Other materials may be used however, preferably of the type which can be processed with specifically shaped dies in an injection moulding process.

Masks 17 of a non-transparent material are applied to the surface of the vessel cover 25 remote from the reaction areas 15, which, seen in a plan view as indicated by the direction of arrow 16, surround the reaction areas 15 from outside. The masks 17 may be printed onto the vessel cover 25 or attached to the vessel cover 25 in the form of a film bearing the masks 17. A film bearing masks 17 can also be applied by "in mould labelling".

Figure 8:
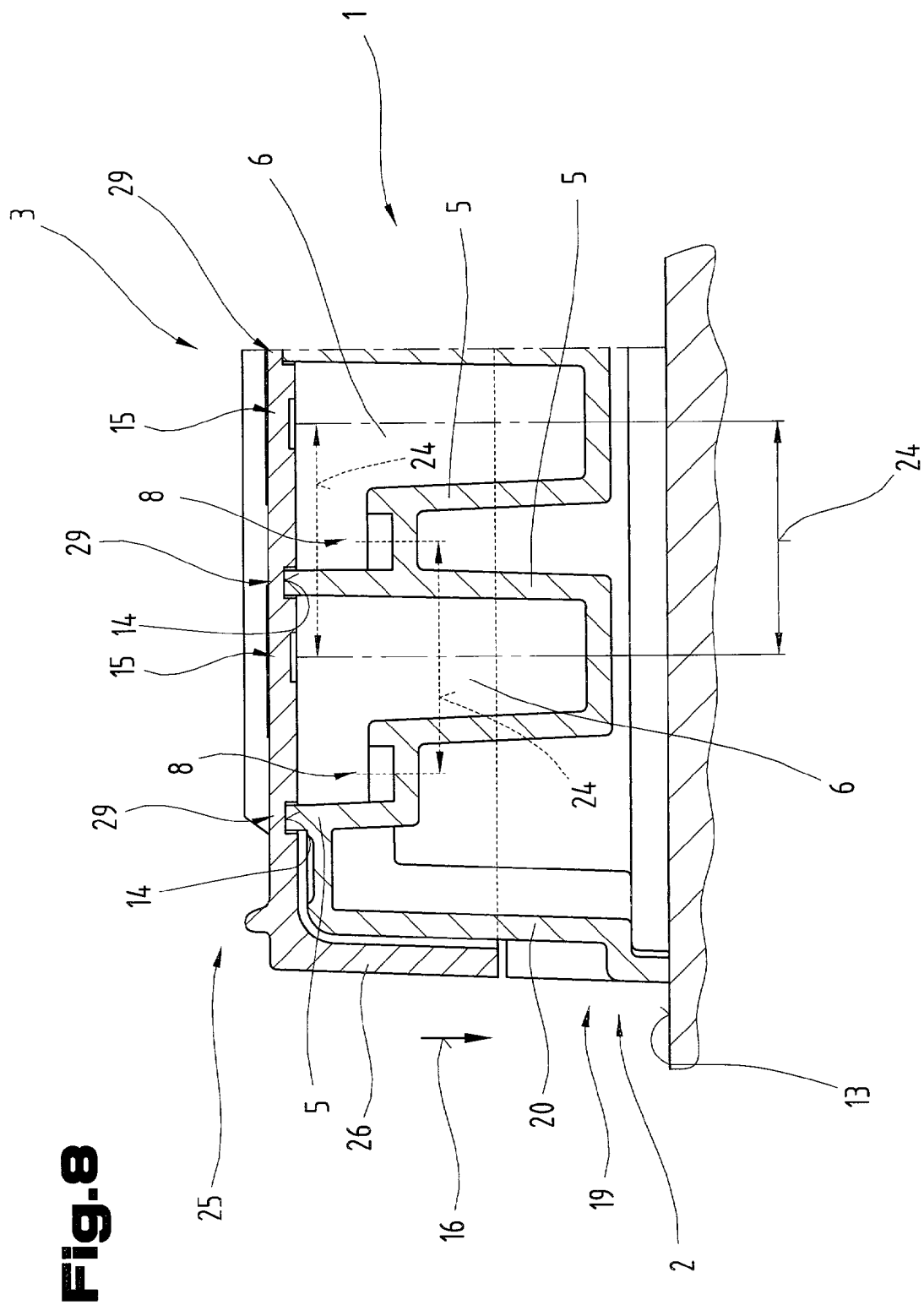
FIG. 8 is a section of a reaction vessel consisting of a housing bottom part and a vessel cover in the assembled state.

FIG. 8 illustrates a vessel bottom part 2 and a vessel top part 3 of a reaction vessel 1 in the assembled state.

The frame 26 of the vessel cover 25 is inverted above the frame 20 of the housing bottom part 19. Accordingly, the grooves 29 of the vessel cover 25 sit on the top edges of the vessel walls 5 of the vessel bottom part 19 so that the reaction chambers 6 are sealed off from the outside by an additional sealing layer 14 in the grooves 29. Respective immediately adjacent reaction chambers 6 are laterally offset from one another by the row width 24, being demarcated from one another by a common vessel wall 5. Similarly, the reaction areas 8 of two immediately adjacent reaction chambers 6 are laterally offset from one another by the row width 24 in the same way as the reaction areas 15 of the vessel cover 25. By contrast, however, the reaction areas 15 of the vessel cover 25 are laterally offset from the reaction areas 8 of the housing bottom part 19 by approximately half the value of the row width 24.

As described with reference to the embodiments illustrated in FIGS. 4 and 5 and FIGS. 6 and 7 with regard to immediately adjacent rows of reaction areas 8 and immediately adjacent rows of reaction areas 15, this means overall that rows of immediately adjacent reaction areas 8 and rows of immediately adjacent reaction areas 15 are arranged one after the other with a lateral offset corresponding to approximately half the row width 24. Furthermore, every row of reservoirs 7 co-operates with at least one row of reaction areas 8.

Figure 9:
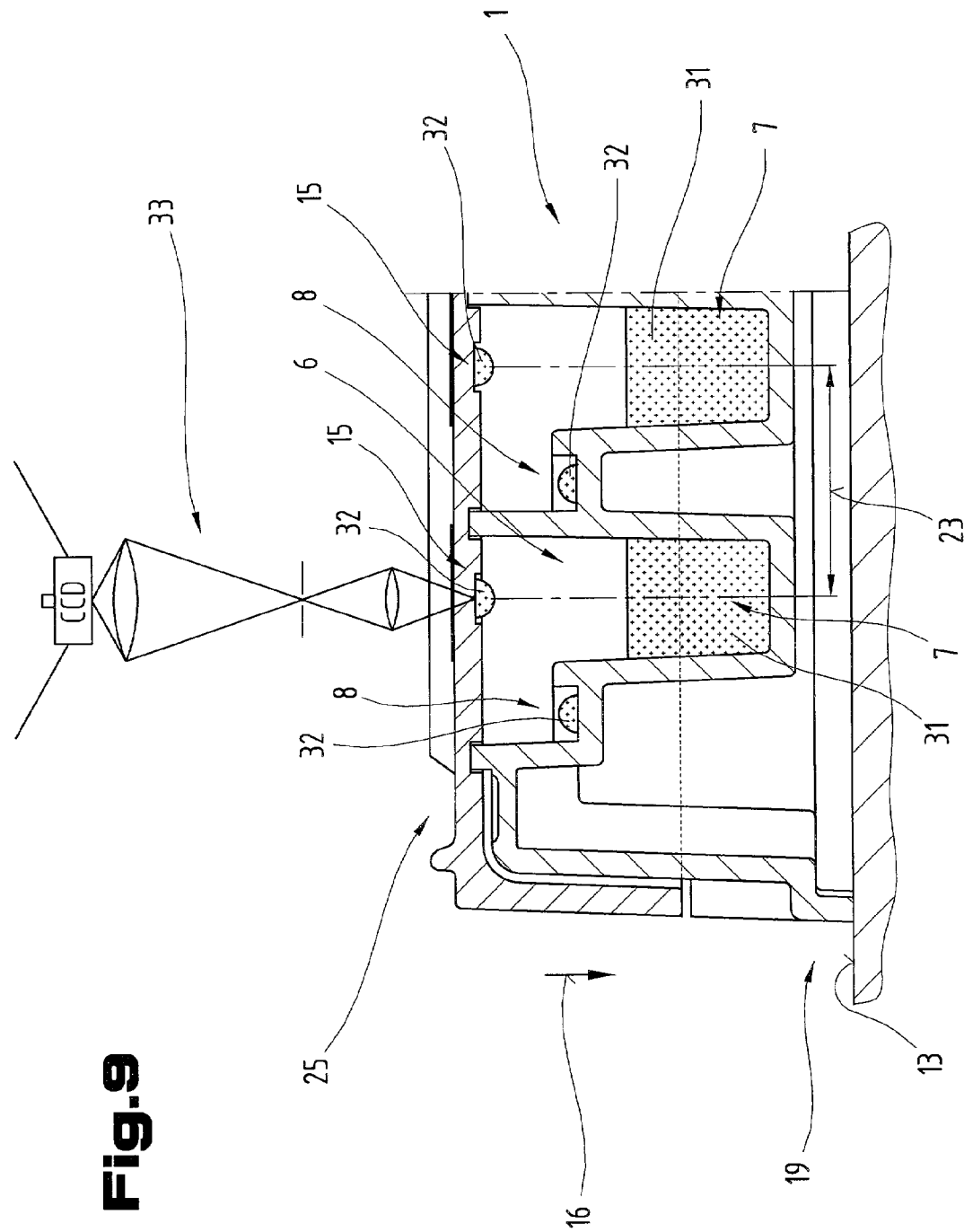
FIG. 9 is a diagram illustrating the principle of how a reaction vessel is used.

FIG. 9 illustrates the principle on which a reaction vessel 1 proposed by the invention is used. The reservoirs 7 of the reaction chambers 6 are filled with an agent 31 whilst a reaction solution 32 is placed in the reaction areas 8 and the reaction areas 15. Within a reaction chamber 6, an exchange of substances can take place between the agent 31 and the reaction solutions 32 by vapour diffusion.

Since at least the vessel cover 25 is made from a transparent material, the reactions in the reaction solutions 32 can be observed with a microscope 33 through the vessel cover 25. Because the reaction areas 8 and the reaction areas 15 are disposed laterally offset from one another, reactions in the reaction solutions 32 in both reaction areas 8, 15 can be observed simultaneously without having to open the reaction chambers 6.

An example of a reaction which can be conducted in a reaction vessel 1 is that of producing a crystal from a sample dissolved in a crystallisation solution on the principle of vapour diffusion, as already explained with reference to FIGS. 1 to 3. By means of vapour diffusion, a shift in concentration is brought about in the reaction solutions 32 of the reaction areas 8 and 15 due to the formation of crystals, in particular single crystals. The crystals forming in the reaction solutions 32 can be observed from outside with the aid of a microscope 33.

For the sake of good order, it should finally be pointed out that in order to provide a clearer understanding of the structure of the reaction vessel 1, it and its constituent parts have been illustrated out of scale to a certain extent and/or on an enlarged and/or reduced scale.

The tasks underlying the independent inventive solutions can be found in the description.

Above all, subject matter relating to the individual embodiments illustrated in FIGS. 1, 2, 3; 4, 5; 6, 7; 8; 9 can be construed as independent solutions proposed by the invention. The tasks and solutions can be found in the detailed descriptions relating to these drawings.

What is claimed is:

1. Reaction vessel comprising a vessel bottom part with a vessel floor and vessel walls forming several walled reaction chambers, each reaction chamber having inside thereof a reservoir for liquid agents and at least one reaction area separated from the reservoir and having a gas connection thereto, adjacent ones of the walled reaction chambers being demarcated from one another by a common vessel wall, whereby the number of reaction chambers in the reaction vessel is maximized; a vessel top part, which lies against the vessel walls, optionally with a sealing layer in between, covering the walled reaction chambers; and at least another reaction area formed by a recess above the reservoir in the vessel top part.

2. Reaction chamber as claimed in claim 1, characterised in that the reaction areas are of a vessel-type design and every two are separated from one another by a common wall.

3. Reaction vessel as claimed in claim 1, characterised in that the recess is of a cylindrical disc shape or in the form of a plate-like, quadratic cuboid.

4. Reaction vessel as claimed in claim 1, characterised in that the recess is designed to have a capacity in the region of less than 5 $\mu$l.

5. Reaction vessel as claimed in claim 1, characterised in that a floor of the recess forming the at least one reaction area in the vessel top part is of an at least approximately convex curvature with reference to this recess.

* * * * *